United States Patent
Taira

(10) Patent No.: US 7,608,163 B2
(45) Date of Patent: Oct. 27, 2009

(54) SUBSTRATE PROCESSING APPARATUS AND METHOD

(75) Inventor: Masaki Taira, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/454,130

(22) Filed: Jun. 3, 2003

(65) Prior Publication Data
US 2003/0224625 A1 Dec. 4, 2003

(30) Foreign Application Priority Data
Jun. 4, 2002 (JP) .............................. 2002-162718

(51) Int. Cl.
H01L 21/304 (2006.01)
B08B 3/02 (2006.01)

(52) U.S. Cl. .................. 156/345.55; 118/500; 118/728; 156/345.51

(58) Field of Classification Search ................. 118/500, 118/728; 156/345.51, 345.55
See application file for complete search history.

(56) References Cited

U.S. PATENT DOCUMENTS

| | | | |
|---|---|---|---|
| 5,174,045 A * | 12/1992 | Thompson et al. ............. | 34/58 |
| 5,232,328 A * | 8/1993 | Owczarz et al. ............. | 414/590 |
| 5,339,539 A * | 8/1994 | Shiraishi et al. ............. | 34/58 |
| 5,784,797 A | 7/1998 | Curtis et al. | |
| 6,067,727 A * | 5/2000 | Muraoka ...................... | 34/317 |
| 6,115,867 A * | 9/2000 | Nakashima et al. ............. | 15/77 |
| 6,269,552 B1 * | 8/2001 | Honda et al. .................. | 34/317 |
| 6,286,825 B1 * | 9/2001 | Tseng et al. ................. | 269/287 |
| 6,513,537 B1 * | 2/2003 | Orii et al. ...................... | 134/1.2 |
| 6,532,975 B1 * | 3/2003 | Kamikawa et al. ............. | 134/61 |
| 6,568,412 B2 * | 5/2003 | Egashira ...................... | 134/159 |
| 6,647,642 B2 * | 11/2003 | Kamikawa et al. ............. | 34/490 |
| 6,660,089 B2 * | 12/2003 | Nozawa et al. ............. | 118/500 |
| 6,743,297 B2 * | 6/2004 | Egashira et al. ............. | 118/730 |
| 6,776,173 B2 * | 8/2004 | Kamikawa ................. | 134/57 R |

(Continued)

FOREIGN PATENT DOCUMENTS

JP 06-232111 8/1994

(Continued)

OTHER PUBLICATIONS

Computer-Generated English Translation of JP08-274060, published Oct. 18, 1996.*

*Primary Examiner*—Sylvia R. MacArthur
(74) *Attorney, Agent, or Firm*—Morrison & Foerster LLP

(57) ABSTRACT

In a substrate processing apparatus that supports substrates W by a plurality of holding members of a rotor to process the substrates W rotated by the rotor, any one of the holding members is provided with press devices 130 to apply pressures on the peripheries of the substrates W. Each press device 130 has an abutting part 160 for contact with the periphery of the substrate W, a cylinder mechanism 161 for moving the abutting part 160 between a position in contact with the periphery of the substrate W and another position apart from the periphery of the substrate W and a deformable part 162 elastically deformed by the movement of the abutting part 160 to isolate the cylinder mechanism 161 from an atmosphere around the substrates W. Consequently, it is possible to provide the substrate processing apparatus and method that do not cause a diaphragm to be deformed excessively.

12 Claims, 9 Drawing Sheets

U.S. PATENT DOCUMENTS

| | | | |
|---|---|---|---|
| 6,792,958 B2 * | 9/2004 | Kamikawa | 134/95.3 |
| 6,799,586 B2 * | 10/2004 | Kamikawa et al. | 134/25.4 |
| 2002/0170571 A1 * | 11/2002 | Egashira et al. | 134/1.3 |
| 2005/0103364 A1 * | 5/2005 | Kamikawa | 134/57 R |

FOREIGN PATENT DOCUMENTS

| | | | |
|---|---|---|---|
| JP | 08274060 A | * | 10/1996 |

* cited by examiner

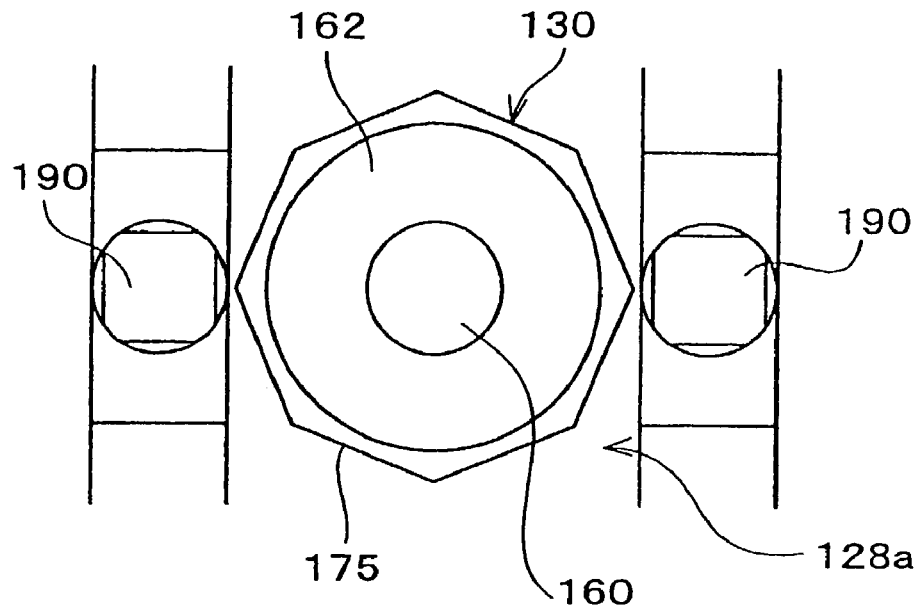
F I G. 8A
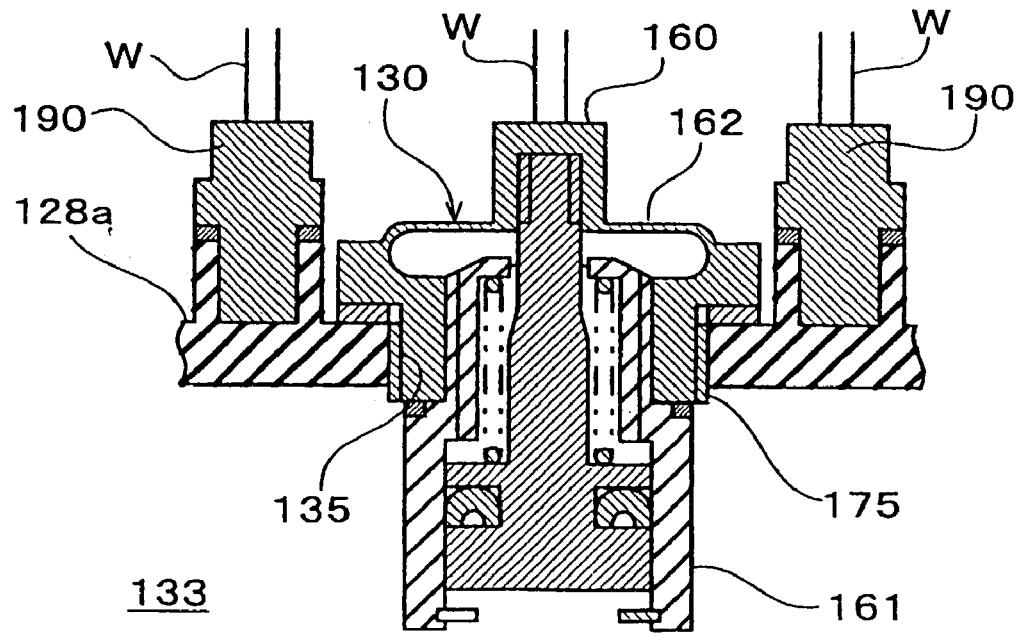
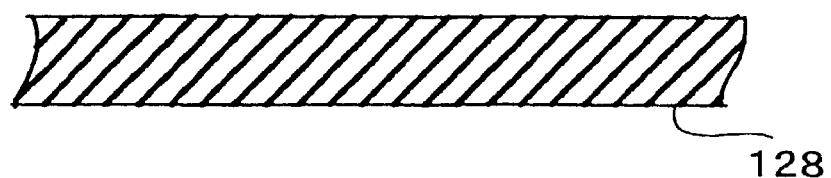
F I G. 8B

SUBSTRATE PROCESSING APPARATUS AND METHOD

BACKGROUND OF THE INVENTION

1. Technical Field of the Invention

This invention relates to substrate processing apparatus and method for processing (e.g. cleaning) a substrate, for example, semiconductor wafer, glass for LCD substrate, etc.

2. Description of the Related Art

As rotary substrate processing apparatuses of this kind, for example, Japanese Unexamined Patent Publication (kokai) No. 6-232111 and U.S. Pat. No. 5,784,797 each disclosed a rotary substrate processing apparatus that includes a rotor capable of holding a plurality of disc-shaped substrates (e.g. semiconductor wafers) paralleled with each other. In this rotary substrate processing apparatus, the rotor is equipped with holding means, for example, a plurality of holding rods for supporting the peripheries of the substrates. The substrates to be processed can be retained in the rotor where the holding rods are abutting on the peripheries of the substrates. The holding rods each has a plurality of guide grooves formed at regular intervals in positions for abutment with the substrates. Owing to the provision of these guide grooves, the rotor is capable of stable holding of the substrates.

The so-constructed rotary substrate processing apparatus sprays the substrates to be processed with specified liquid, for example, chemical liquids, deionized (pure) water, etc. while rotating the rotor at designated revolutions, in order to remove contaminants (e.g. particles, organic pollutant), resist films, oxidation films, etc. from the substrates throughout. After that, in order to dry the substrates, the rotor is rotated to blow the used liquid away from the substrates by making use of resultant centrifugal force.

However, the above rotary substrate processing apparatus is ineffective for removal requirement in accordance with the processing recipe because the revolution of the substrates does not follow the rotor rotating at a high speed.

Additionally, the holding condition between the substrates and the holding rods becomes uneven due to the presence of dimensional errors among the substrates. Therefore, the substrates cannot be processed uniformly, thereby causing a fear of deteriorating the processing efficiency of the apparatus.

Moreover, there is the possibility that at starting or stopping rotation of the rotor, the substrates slip on the holding rods to increase their abrasion, requiring an early exchange of the holding rods to new ones.

SUMMARY OF THE INVENTION

Taking the above situation into consideration, an object of the present invention is to provide rotary substrate processing apparatus and method that allow the substrates to follow the rotation of the rotor for improvement in the processing efficiency of the substrate and that suppress relative slip between the holding means of the rotor and the substrates as possible in order to decrease the abrasion of the holding means and increase the life span of the holding means.

The first feature of the present invention resides in the provision of a substrate processing apparatus for processing substrates, comprising: a rotor having holding members for holding the peripheries of the substrates, the rotor rotating the substrates thereby processing the substrates; and press devices provided in any one of the holding members to apply pressures on the peripheries of the substrates, the press devices having respective abutting parts for contact with the peripheries of the substrates, wherein the press devices are adapted so as to allow the abutting parts to make elastic contact with or depart from the peripheries of the substrates.

The second feature of the present invention resides in that each of the press devices includes: a cylinder mechanism for moving each of the abutting parts between a position in contact with the periphery of the substrate and another position apart therefrom; and a deformable part elastically deformed by the movement of the abutting part to isolate the cylinder mechanism from an atmosphere around the substrates. According to the substrate processing apparatus, there is no fear of applying an excessive load on a diaphragm as the deformable part.

According to the third feature of the present invention, each of the holding members is either a movable holding member movable in relation to the rotor or a fixed holding member fixed to the rotor, and the press devices are provided in the fixed holding member.

According to the fourth feature of the present invention, the movable holding member is brought into its opened condition and the press devices are arranged in positions apart from the substrates when the substrates are loaded into the rotor or discharged therefrom.

According to the fifth feature of the present invention, the holding members are arranged in the circumferences of the substrates by at least three holding members, and the pressure devices are arranged in at least one holding member of the at least three holding members.

According to the sixth feature of the present invention, the at least three holding members comprise at least one movable holding member and at least two fixed holding members, and the press devices are arranged in at least one fixed holding member of the at least two fixed holding members.

According to the seventh feature of the present invention, the substrates are arranged in parallel with each other by two or more substrates, and the holding members extending in a direction to arrange the substrates are arranged in the circumference of the two or more substrates.

According to the eighth feature of the present invention, the holding members has a first fixed holding member and a second fixed holding member both provided with the press devices, the press devices provided in the first fixed holding member are arranged on the circumferential sides of substrates in odd-numbered order of the plural substrates, and the press devices provided in the second fixed holding member are arranged on the circumferential sides of substrates in even-numbered order of the plural substrates.

According to the ninth feature of the present invention, the each of the press devices further includes an elastic member which applies an elastic force on the abutting part in a direction to separate the abutting part from the periphery of the substrate.

According to the tenth feature of the present invention, the cylinder mechanism is equipped with a pressure sensor for detecting a pressure of a working fluid introduced into the cylinder mechanism and derived therefrom.

According to the eleventh feature of the present invention, each of the press devices includes a deformable space that expands and shrinks corresponding to the elastic deformation of the deformable part.

According to the twelfth feature of the present invention, the cylinder mechanism is equipped with a packing ring that suppresses an inflow of a working fluid into the deformable space.

The thirteenth feature of the present invention resides in that each of the press devices further includes: a deformable part that supports each of the abutting parts and is elastically deformed to move the abutting part between a position in contact with the periphery of the substrate and another position apart therefrom; and a stopper member that covers the deformable part and restricts a deformation of the deformable part to move the abutting part toward the periphery of the substrate. According to the substrate processing apparatus mentioned above, it is possible to prevent a diaphragm from being deformed excessively and damaged.

According to the fourteenth feature of the present invention, each of the holding members is either a movable holding member movable in relation to the rotor or a fixed holding member fixed to the rotor, and the press devices are provided in the fixed holding member.

According to the fifteenth feature of the present invention, the movable holding member is brought into its opened condition and the press devices are arranged in positions apart from the substrates when the substrates are loaded into the rotor or discharged therefrom.

According to the sixteenth feature of the present invention, the holding members are arranged in the circumferences of the substrates by at least three holding members, and the pressure devices are arranged in at least one holding member of the at least three holding members.

According to the seventeenth feature of the present invention, the at least three holding members comprise at least one movable holding member and at least two fixed holding members, and the press devices are arranged in at least one fixed holding member of the at least two fixed holding members.

According to the eighteenth feature of the present invention, the substrates are arranged in parallel with each other by two or more substrates, and the holding members extending in a direction to arrange the substrates are arranged in the circumference of the two or more substrates.

According to the nineteenth feature of the present invention, the holding members has a first fixed holding member and a second fixed holding member both provided with the press devices, the press devices provided in the first fixed holding member are arranged on the circumferential sides of substrates in odd-numbered order of the plural substrates, and the press devices provided in the second fixed holding member are arranged on the circumferential sides of substrates in even-numbered order of the plural substrates.

According to the twentieth feature of the present invention, the each of the press devices includes: a deformable space that expands and shrinks corresponding to the elastic deformation of the deformable part; and a fluid passage for introducing a fluid into the deformable space and deriving the fluid therefrom. In this case, even it a diaphragm as the deformable part is subjected to permanent set, the absorption of the deformable space allows the diaphragm to be restored to the formal position, whereby it is possible to make the abutting part move back to an isolated position.

According to the twenty-first feature of the present invention, the substrate processing apparatus further comprises a pressure sensor for detecting a pressure of the fluid introduced into the deformable space and derived therefrom.

According to the twenty-second feature of the present invention, the stopper member is provided with a drain groove for draining a liquid adhering between the deformable part and the stopper member.

According to the twenty-third fourth feature of the present invention, there is also provided a substrate processing method for processing a substrate by rotating a rotor having a plurality of holding members holding a periphery of the substrate, the method comprising the steps of: loading the substrate into the rotor, allowing the holding members to hold the periphery of the substrate and allowing a press device installed in the rotor to apply a pressure on the periphery of the substrate, thereby holding the substrate so as not to produce a slippage between the periphery of the substrate and the holding members; processing the substrate while rotating the substrate and the rotor in one body; releasing pressing of the press device, producing the slippage between the periphery of the substrate and the holding members by a centrifugal force of the substrate, thereby holding the periphery of the substrate at difference positions from those at the step of processing the substrate; and again allowing the press device to apply a pressure on the periphery of the substrate, thereby holding the substrate so as not to produce a slippage between the periphery of the substrate and the holding members and processing the substrate while rotating the substrate and the rotor in one body.

BRIEF DESCRIPTION OF THE DRAWINGS

FIGS. 8A and 8B are views showing a holding rod where press units and abutting members are arranged alternately, in accordance with another embodiment of the invention, FIG. 8A is a plan view of the holding rod and FIG. 8B is a sectional view of FIG. 8A; FIG. 9A is a plan view of the press unit and FIG. 9B is a sectional view of FIG. 9A.

DESCRIPTION OF THE PREFERRED EMBODIMENT

Preferred embodiments of the present invention will be described by an example of a substrate processing apparatus to clean wafers, below.

Figure 1:
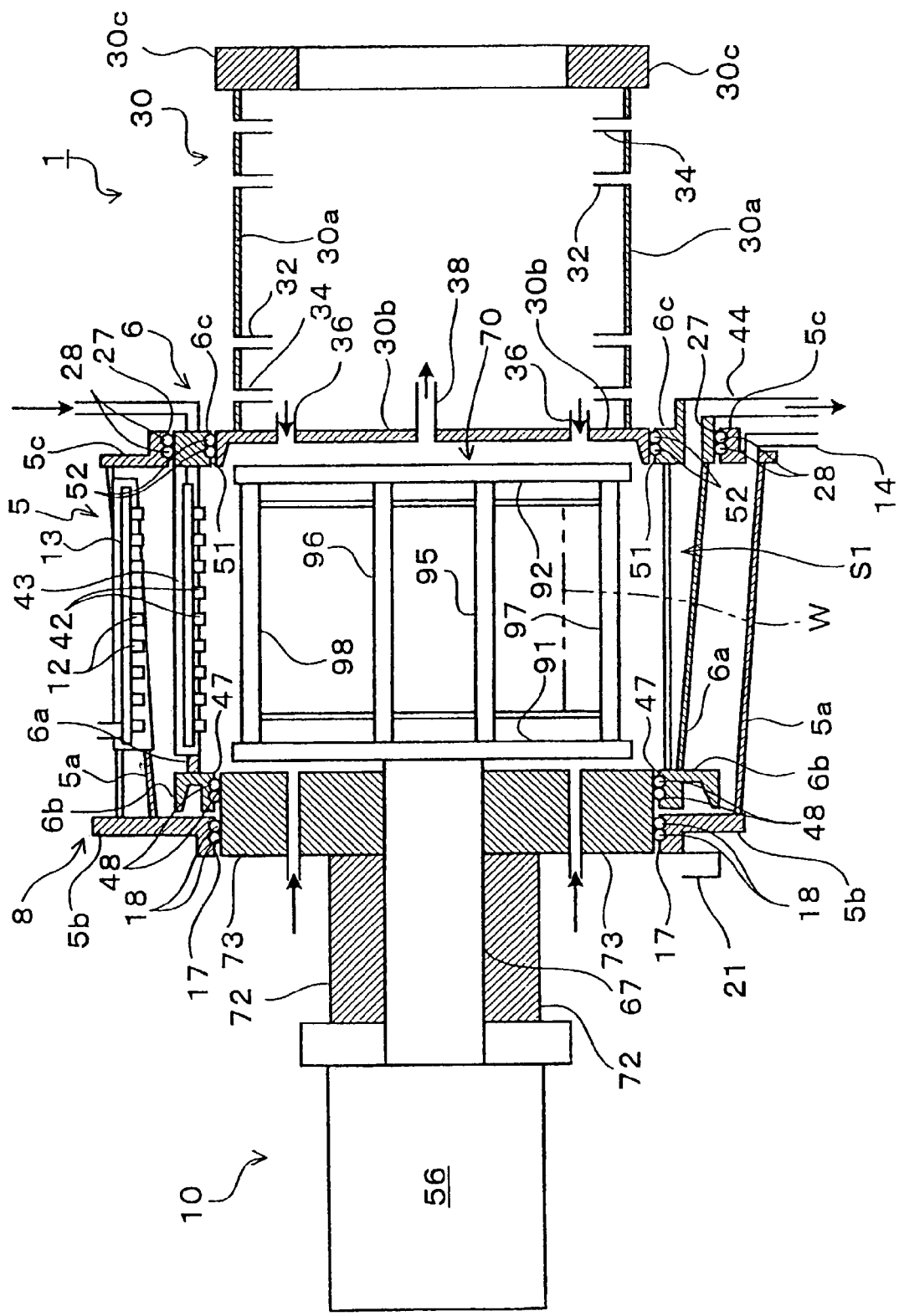
FIG. 1 is a sectional view of a substrate processing apparatus to make an inner chamber enter into an outer chamber.

As shown in FIG. 1, the substrate processing apparatus 1 includes a double chamber 8 having a fixed outer chamber 5 and an inner chamber 6 movable inside and outside the outer chamber 5 in the horizontal direction. The apparatus 1 further includes a rotor rotating mechanism 10 for holding a plurality of wafers W (e.g. 25 pieces of wafers) paralleled with each other at regular intervals and rotating the wafers W. The rotor rotating mechanism 10 is movable outside and outside the double chamber 8 in the horizontal direction.

The outside chamber 5 is formed by a cylindrical body 5a supported at a designated position by a not-shown frame and ring members 5b, 5c fixed to both ends of the cylindrical body 5a respectively. Above the cylindrical body 5a, a processing-fluid discharging nozzle 13 is provided with a number of ejection orifices 12 in the horizontal direction. Below the cylindrical body 5a, a discharging pipe 14 is provided to discharge processing liquid and gas from the outer chamber 5.

The ring member 5b has an inlet/outlet port 17 (for the rotor rotating mechanism) formed to allow the rotor rotating mechanism 10 to come in and out the double chamber 8.

When the rotor rotating mechanism 10 leaves the double chamber 8, the port 17 can be closed or opened by a not-shown lid body. An annular seal mechanism 18 is arranged on the inner circumferential face of the port 17. Outside the ring member 5b, a liquid receptacle 21 is arranged underside of the port 17. Owing to the provision of the liquid receptacle 21, it becomes possible to receive the processing liquid adhering to the seal mechanism 18 etc. when retreating the rotor rotating mechanism 10 from the double chamber 8 after the process of wafer W.

The ring member 5c has an inlet/outlet port 27 (for the inner chamber) formed to allow the inner chamber 6 to come in and out the outer chamber 5. An annular seal mechanism 28 is arranged on the inner circumferential face of the port 27. Outside the ring member 5c, a cleaning mechanism 30 is arranged to clean the inner chamber 6. The inner chamber 6 surrounds the cleaning mechanism 30 when withdrawing from the inside of the outer chamber 5.

The cleaning mechanism 30 is constituted by a cylindrical body 30a surrounded by the inner chamber 6 leaving the outer chamber 5, a circular disk 30b formed on a face close to the ring member 5c of the cylindrical body 30a and arranged so as to be surrounded by the inner circumferential face of the port 27 and a ring member 30c formed on the other face of the cylindrical body 30a. The cylindrical body 30a is provided with gas nozzles 32 ejecting gas against the outer peripheral side of the cylindrical body 30a, that is, the inner circumference of the inner chamber 6 surrounding the cylindrical body 30a and exhaust pipes 34 for discharging an atmosphere from a space between the inner circumference of the inner chamber 6 surrounding the cylindrical body 30a and the outer circumference of the cylindrical body 30a. The circular disk 30b is provided with cleaning-liquid discharging nozzles 36 for ejecting cleaning liquid and gas into the outer chamber 5 and an exhaust pipe 38 for exhausting an atmosphere in the outer chamber 5. The above-constructed cleaning mechanism 30 cleans the inner circumferential face of the inner chamber 6 moved to its withdrawal position with gas supplied through the gas nozzles 32.

The inner chamber 6 is formed by a cylindrical body 6a and ring members 6b, 6c fixed to both end faces of the cylindrical body 6a. The cylindrical body 6a is formed to have a size enabling its movement from the center of the ring member 5b to the inside of the cylindrical body 5a, surrounding the outer periphery of the rotor rotating mechanism 10 and also surrounding the outer periphery of the cylindrical body 30a. Above the cylindrical body 6a, a processing-liquid nozzle 43 is provided with a number of ejection orifices 42 in the horizontal direction. Below the cylindrical body 6a, an exhaust pipe 44 for discharging waste fluid of the processing liquid and gas from the inner chamber 6.

The ring member 6b has an inlet/outlet port 47 (for the rotor rotating mechanism) formed to allow the rotor rotating mechanism 10 in the outer chamber 5 to come in and out the inner chamber 6 relatively. An annular seal mechanism 48 is arranged on the inner circumferential face of the port 47. The ring member 6c has a through port 51 formed to have a size enabling a relative passage of the cleaning mechanism 30 therein. An annular seal mechanism 52 is arranged on the inner circumferential face of the ring member 6c.

The rotor rotating mechanism 10 includes a motor 56, a rotating shaft 67 for the motor 56 and a rotor 70 attached to the leading end of the rotating shaft 67 to hold twenty five wafers W paralleled with each other at regular intervals. The motor 56 is supported by a casing 72 surrounding the rotating shaft 57. The casing 72 is supported by a not-shown movable supporting mechanism. The movable supporting mechanism can move the whole rotor rotating mechanism 10 in the horizontal direction to make the rotor 70 come in and out the double chamber 8. Arranged between the casing 70 and the rotor 70 is a disk-shaped lid body 73 that is fixed to the leading end of the casing 72 and is sized so as to close the ports 17, 47 when the rotor 70 enters the double chamber 8.

As shown in FIG. 1, when the inner chamber 6 is arranged in a processing position inside the outer chamber 5 and the rotor 70 is arranged in the inner chamber 6, the ring member 6c is arranged so as to close between the port 27 and the disk 30b. Then, the seal mechanism 28 seals up between the ring member 5c and the ring member 6c, while the seal mechanism 52 seals up between the ring member 6c and the disk 30b. Also, the lid body 73 is arranged to close the inlet/outlet port 17, 47, and the seal mechanism 18 seals up between the ring member 5b and the lid body 73.

Further, the seal mechanism 48 seals up between the ring member 6b and the lid body 73. In this way, all of the disk 30b, the ring member 6c, the cylindrical body 6a, the ring member 6b and the lid body 73 form a processing space S1.

Figure 2:
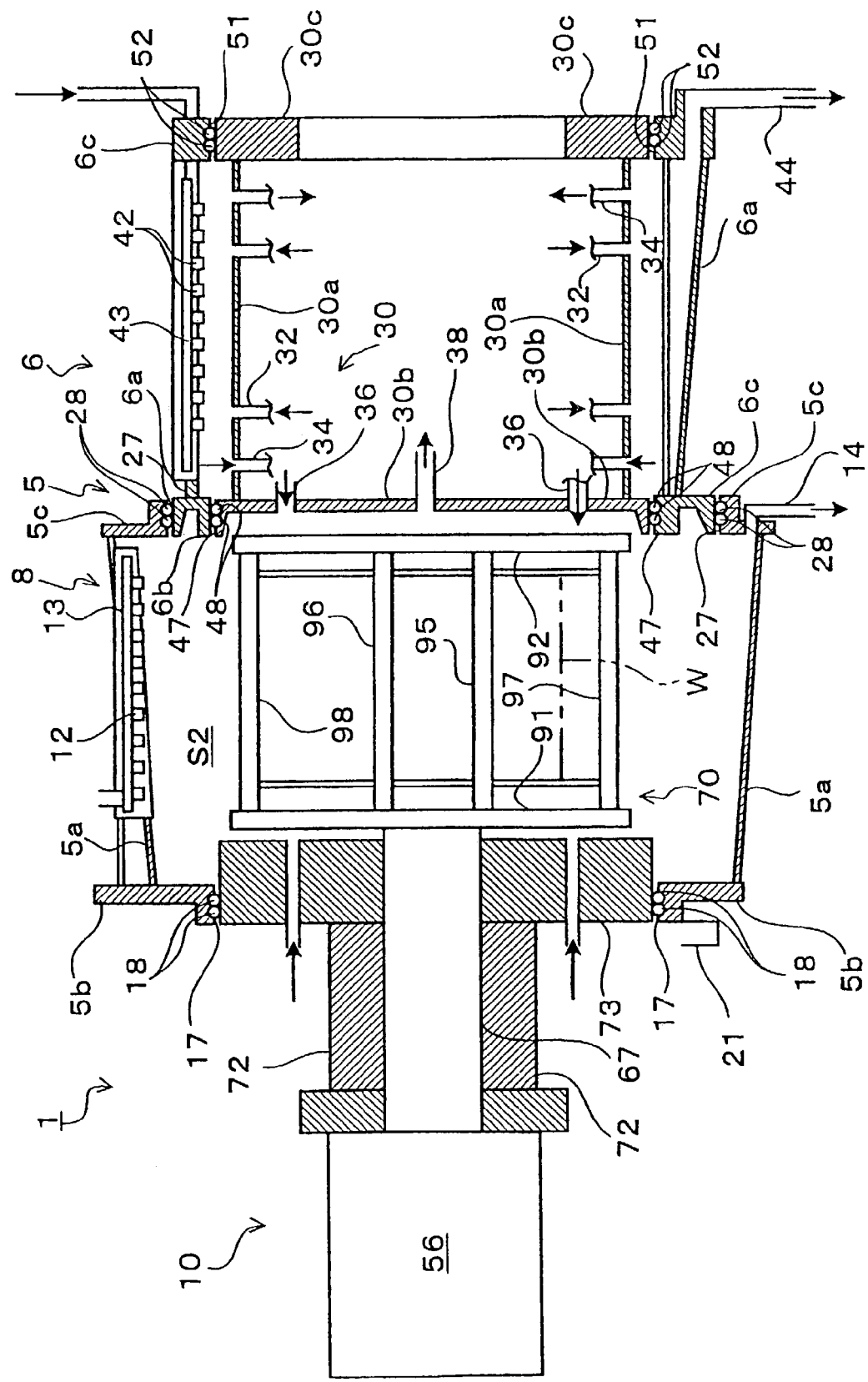
FIG. 2 is a sectional view of the substrate processing apparatus to make the inner chamber withdraw from the outer chamber.

As shown in FIG. 2, when the inner chamber 6 is withdrawn from the outer chamber 5 and arranged in a withdrawal position and the rotor 70 is arranged in the outer chamber 7, the ring member 6b is arranged so as to close between the port 27 and the disk 30b. Then, the seal mechanism 28 seals up between the ring member 5c and the ring member 6b, while the seal mechanism 48 seals up between the ring member 6b and the disk 30b. Further, the lid body 73 is arranged so as to close up the port 17, while the sealing mechanism 18 seals up between the ring body 5b and the lid body 73. In this way, all of the disk 30b, the ring member 6b, the ring member 5c, the cylindrical body 5a, the ring member 5b and the lid body 73 form a processing space S2.

Figure 3:
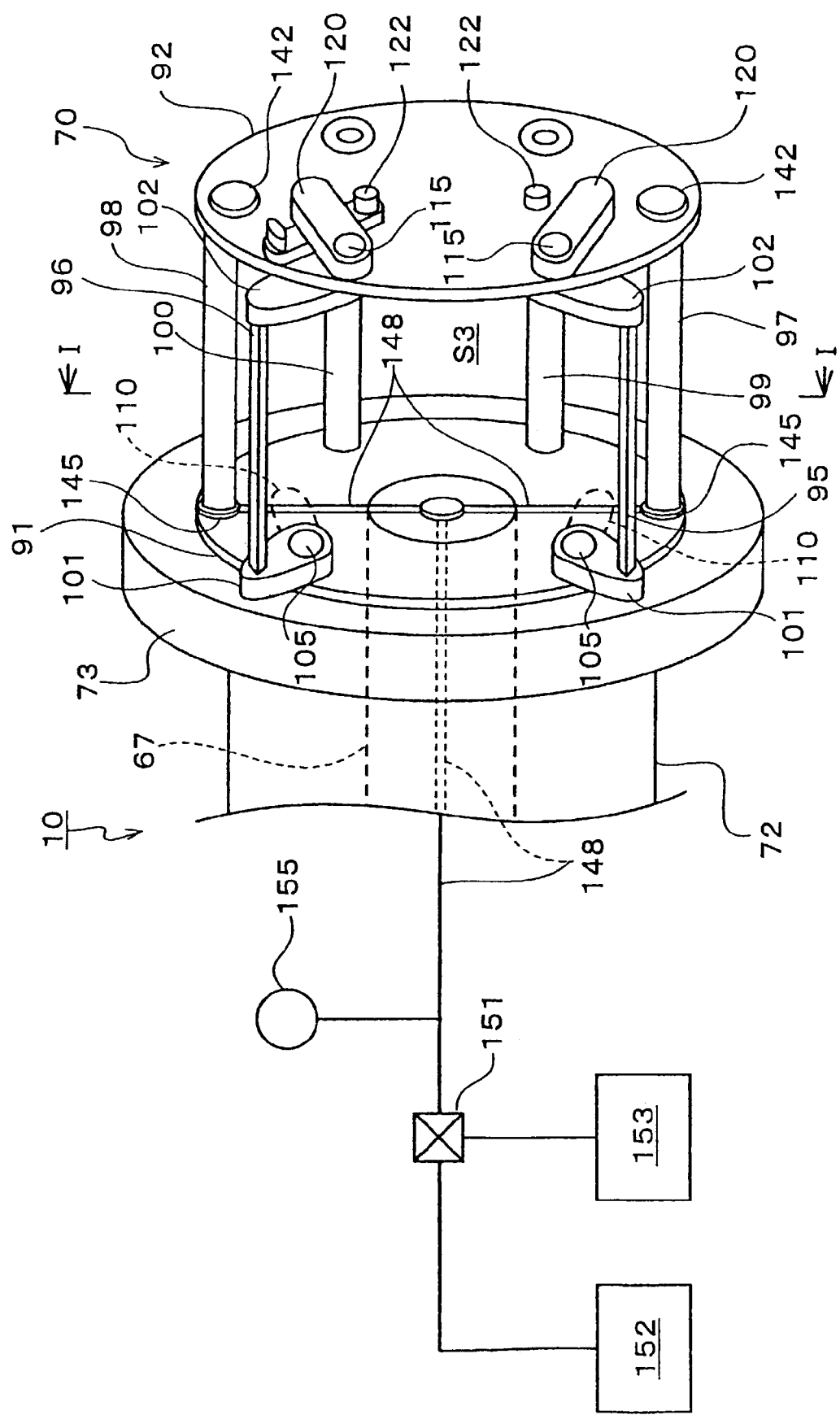
FIG. 3 is a perspective view of a rotor.

FIG. 3 is a perspective view of the schematic structure of the rotor 70. As shown in FIG. 3, the rotor 70 has a pair of disks 91, 92 arranged at a predetermined interval to allow an insertion of twenty five wafers W. The disk 91 is attached to the leading end of the rotating shaft 67, while the disk 92 is arranged on the side of the ring member 5c. On a circumference about the rotating shaft 67 as a center, six holding rods 95, 96, 97, 98, 99 and 100 are paralleled with each other in the horizontal direction respectively, for cooperatively holding the peripheries of twenty five wafers W inserted between the disks 91, 92.

Figure 4:
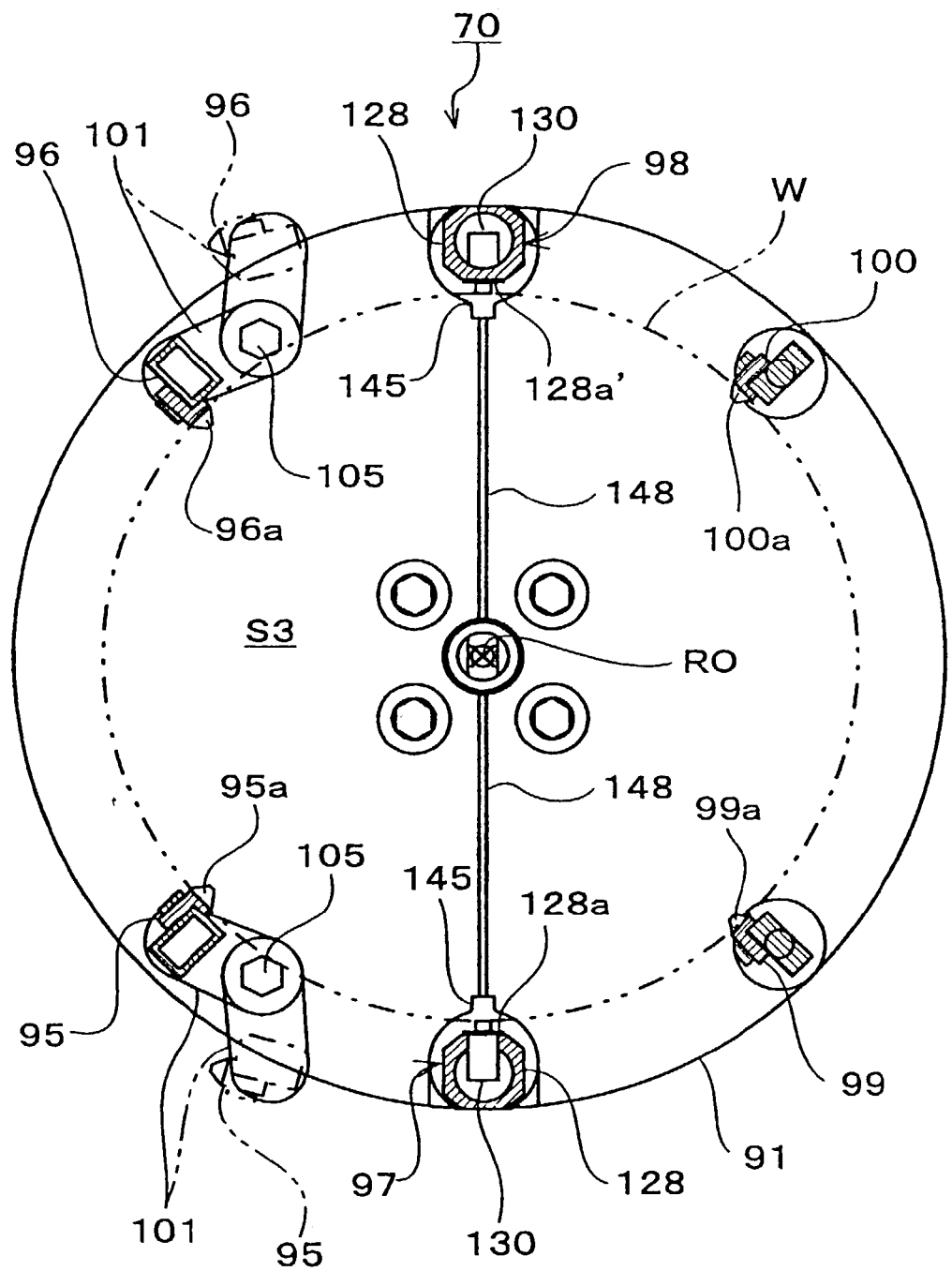
FIG. 4 is a sectional view of the rotor, taken along a line I-I of FIG. 3.

FIG. 4 is a sectional view of the rotor 70, taken along a line I-I of FIG. 3. On the left side of the rotor 70, the openable and closable holding rods 95 and 96 are arranged in symmetry with each other up and down about a rotational center axis RO of the rotating shaft 67. On the top and bottom of the rotor 70, the holding rods 97 and 98 are arranged in symmetry with each other about the rotational center axis RO, provided with mechanisms that apply pressures on the peripheries of the wafers W. On the right side of the rotor 70, the holding rods 99 and 100 are arranged in symmetry with each other up and down about the rotational center axis RO, provided with mechanisms that apply pressures on the peripheries of the wafers W. A space surrounded by the holding rods 95 to 100 provides a holding space S3 for retaining the wafers W. Since six holding rods 95 to 100 hold the peripheries of the wafers W cooperatively, the wafers W loaded to the rotor 70 can be held in parallel with each other.

First, the structure of the holding rod 95 holding the left- and-lower parts of the peripheries of the wafer W of FIG. 4 will be described below. As shown in FIG. 3, the disk 91 is provided, on the side of the space S3, with two arms 101 that can swing in relation to the disk 91. Similarly, the disk 92 is provided, on the side of the space S3, with two arms 102 that can swing in relation to the disk 92. Both ends of the holding rod 95 are supported by the arms 101, 102 respectively.

The base of the arm 101 is supported by a rotatable connecting shaft 105 penetrating the disk 91. The leading end of the arm 101 is fixed to one end of the holding rod 95. On the side of the rotating shaft 67, the rotatable connecting shaft 105 is secured to the base of a balance weight 110. While, the base of the arm 102 is supported by a rotatable connecting shaft 115 penetrating the disk 92. The leading end of the arm 102 is fixed to the other end of the holding rod 95. On the opposite side of the rotating shaft 67, the rotatable connecting shaft 115 is secured to the base of a balance weight 120.

When the leading ends of the balance weights 110, 120 move outside the disks 91, 92 respectively, the rotatable connecting shafts 105, 115 are rotated to move the leading ends of the arms 101, 102 to the inside of the disks 91, 92 respectively, allowing the holding rod 95 to abut on the peripheries of the wafers W.

On a outside face of the disk 92 on the opposite side of the holding space S3, a lock pin 122 is arranged to restrict the rotation of the balance weight 120. In the normal state, the lock pin 122 projects outward to prohibit the weight 120 from rotating. When the rotor 70 moves out of the double chamber 8 and a not-shown closing mechanism outside the chamber 8 depresses the lock pin 122, it becomes possible to rotate the balance weight 120, allowing the holding rod 95 to move to both of one position to make the rod 95 abut on the peripheries of the wafers W and another position to make the rod 95 depart from the wafers W.

The holding rod 96 has a structure in symmetry with that of the rod 95 about the rotational center axis RO. As shown in FIG. 3, the disks 91, 92 are provided, also on their upper portions, with arms 101, 102 that can swing in relation to the disks 91, 92, respectively. Both ends of the holding rod 96 are supported by the arms 101, 102 respectively.

The holding rods 95, 96 has twenty five holding grooves 95*a*, 96*a* formed on the side of the wafers W at regular intervals in the longitudinal direction, respectively. The pitch of the holding grooves 95*a* in arrangement is equal to that of the holding grooves 96*a*. Theses holding grooves 95*a*, 96*a* are arranged in positions corresponding to twenty five wafers W respectively. Each of the grooves 95*a*, 96*a* is substantial-V shaped with opposing slanted faces between which the periphery of the wafer W is to be inserted and retained.

By controlling the rotations of the balance weights 110 through the closing mechanism, the holding rods 95, 96 can approach or depart from each other. Outside the substrate processing apparatus 1, when the wafers W are loaded into the rotor 70 by not-shown wafer transfer mechanism and when the wafers W are discharged from the rotor 70 by the wafer transfer mechanism, the holding rods 95, 96 open. An interval between the holding rods 95, 96 in the opened state provides a loading/unloading position of the wafers W. When holding the wafers W inserted into the space S3, the holding rods 95, 96 close to abut on the peripheries of the wafers W. While maintaining the holding rods 95, 96 in their closed state by the lock pins 122, it is possible to rotate the rotor 70.

Figure 5:
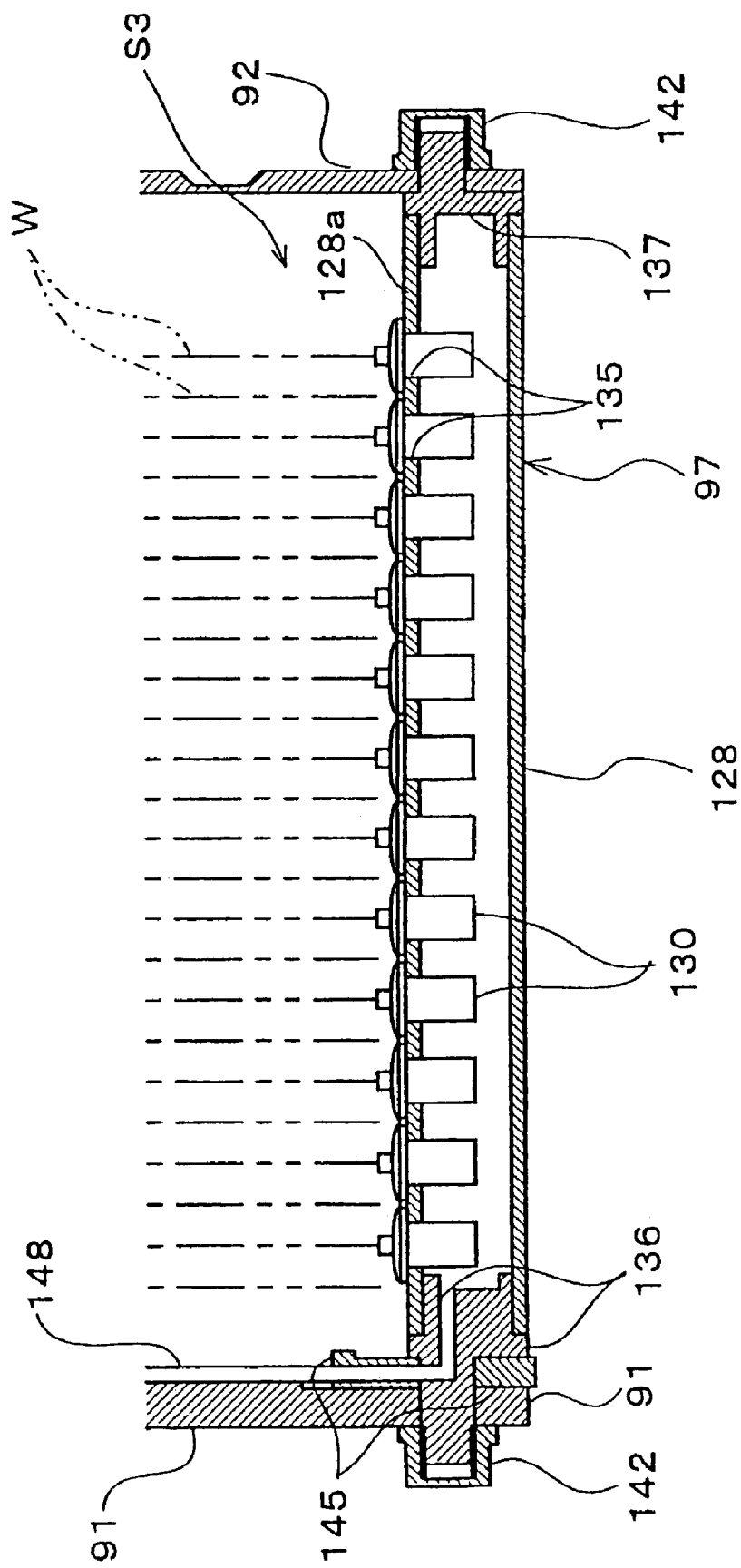
FIG. 5 is a longitudinal sectional view of a holding rod equipped with a press unit.

As shown in FIG. 5, the holding rod 97 that supports the intermediate lower parts of the wafers W in FIG. 4 is formed by a cylindrical body 128 bridging between the disks 91, 92 and twelve press devices 130 arranged on the side of the cylindrical body 128 close to the holding space S3, at regular intervals in the longitudinal direction of the body 128.

Inside the cylindrical body 128, a fluid space 133 is defined to fill the body 128 with fluid. In FIGS. 4 and 5, a flat part 128*a* is formed on the top of the cylindrical body 128. The flat part 128*a* is provided, at regular intervals in the longitudinal direction, with twelve openings 135 that allow the press devices 130 to be inserted and retained therein. On both ends of the cylindrical body 128, connecting members 136, 137 are arranged to connect the body 128 with the disks 91, 92 respectively. On the side of the holding space S3, the connecting members 136, 137 are fitted to the respective ends of the cylindrical body 128. Outside the holding space S3, the connecting members 136, 137 are engaged with nuts. 141, 142, respectively. A fluid-path holding member 145 is arranged between the disk 91 and the connecting member 136. Tightening the nuts 141, 142, the cylindrical body 128 is fixed and held between the disks 91, 92.

A fluid pipe 148 is connected with the cylindrical body 128 to introduce fluid into the fluid space 133 and discharge the fluid therefrom. Penetrating the rotating shaft 67, the fluid pipe 148 is arranged to extend from the center of the disk 91 along its surface on the side of the holding space S3 and connected with the fluid-path holding member 145. Further penetrating the fluid-path holding member 145 and the connecting member 136, the fluid pipe 148 is finally communicated with the fluid space 133. In this embodiment, the fluid space 133 and the fluid pipe 148 form a fluid passage of the invention.

As shown in FIG. 3, the fluid pipe 148 is connected, via a three-directional valve 151, with a pressure device 152 for supplying the pipe 148 with pressurized fluid and a suction device 153 for sucking the fluid from the pipe 148. A pressure sensor 155 is interposed in the pipe 148, for detecting a pressure of the fluid passing through the pipe 148, that is, pressure of the fluid introduced into the press devices 130 and discharged therefrom.

Figure 6:
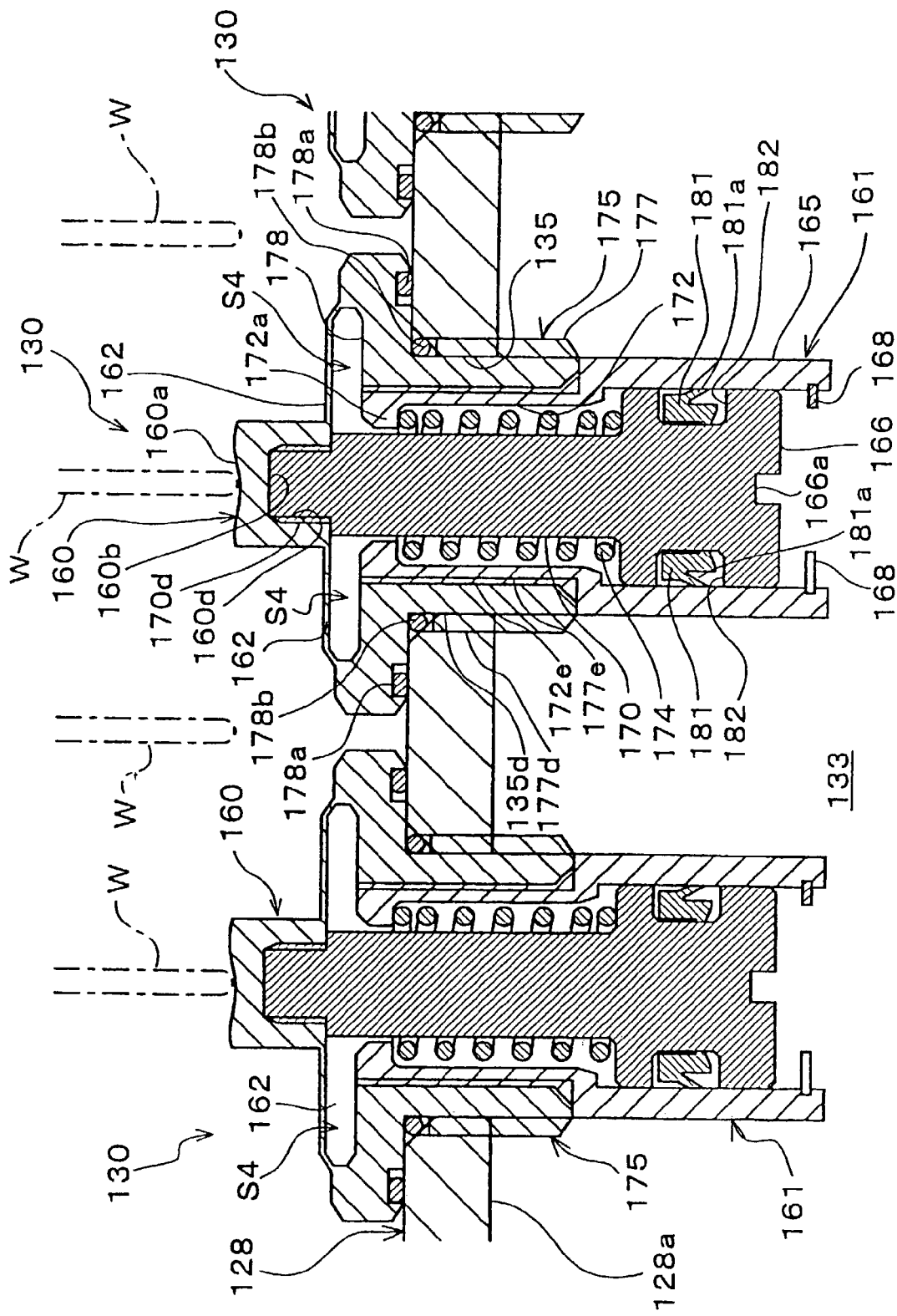
FIG. 6 is a longitudinal sectional view of the press unit.

As shown in FIG. 6, each of the press devices 130 includes an abutting part 160 for abutment with the periphery of the wafer W, a cylinder mechanism 161 for moving the abutting part 160 between one position to make it abut on the periphery of the wafer W and another position to make the abutting part 160 depart from the wafer W, and a diaphragm 162 as deforming part deformed according to movement of abutting part 160 and separating the cylinder mechanism 161 from the atmosphere around wafer W.

Figure 7:
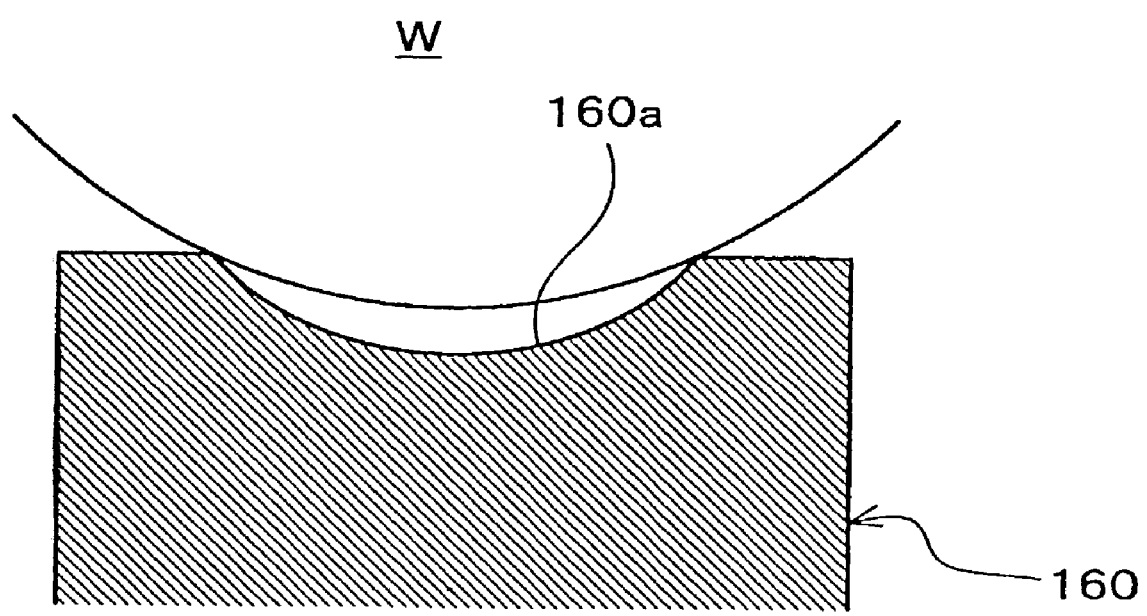
FIG. 7 is a sectional view showing an abutting part in contact with the periphery of one wafer in enlargement.

The abutting part 160 is provided, on its abutting face with the wafer W in FIG. 6, with a recess 160*a* that supports the periphery of the wafer W at two points in the circumferential direction of the wafer W, as shown in FIG. 7.

The cylinder mechanism 161 includes a cylinder 165 and a piston 166 sliding in the cylinder 165. In FIG. 6, the lower end of the cylinder 165 is opened to allow the fluid in the fluid space 133 to apply a fluid pressure on the lower face of the piston 166, allowing the piston 166 to move up and down in the cylinder 165.

In FIG. 6, the cylinder 165 is provided, on its lower inside, with a C-ring 168 to prevent the piston 166 from slipping out of the lower end of the cylinder 165. The piston 166 is provided, on its upper face, with a rod 170 whose top end bears the abutting part 160.

On the top end of the cylinder 165, a cylindrical part 172 is formed to surround the rod 170. Inside the cylindrical part 172, a spring 174 is arranged so as to encircle the rod 170. The top of the cylindrical part 172 is provided, on its inner face, with an annular projection 172*a* to encircle the rod 170. The bottom and top of the spring 174 are supported by the top of the piston 166 and the underface of the projection 172*a*, respectively.

The cylindrical part 172 is carried in a press-device retainer port 135 through a fixing member 175. The fixing member 175 is formed by a cylindrical part 177 supported by the inner face of the retainer port 135 and a disk-shaped ring member 178 formed on a top end of the cylindrical part 177 and having a bore for central passage of the rod 170. A screw part 177d is formed on the outer circumferential face of the cylindrical part 177. Another screw part 177e is formed on the inner circumferential face of the cylindrical part 177. On the other hand, on the inner circumferential face of the retainer port 135, a screw part 135d is formed to engage with the screw part 177d. On the outer circumferential face of the cylindrical part 172, a screw part 172e is formed to engage with the screw part 177e.

In order that the retainer port 135 carries the cylindrical part 172, from the top of the flat part 128a separable from the cylindrical body 128, the screw part 177d is engaged with the screw part 135d to secure the fixing member 175 in the retainer port 135. Thereafter, by engaging the screw part 172e with the screw part 177e through the bottom of the flat part 128a, the cylindrical part 172 is fixed to the fixing member 175. In this way, the cylinder 165 is carried by the cylindrical body 128 through the cylindrical part 172 carried in the retainer port 135.

Note, when the fixing member 175 is secured to the retainer port 135, the lower face of the ring member 178 is arranged so as to closely contact with the flat part 128a formed in the cylindrical body 128. Between the lower face of the ring member 178 and the flat part 128a, O-rings 178a, 178b are arranged in double. In this way, by engaging the screw part 135d with the screw part 177d while interposing the O-rings 178a, 178b, it is possible to prevent fluid in the cylindrical body 128 from flowing out of a clearance between the fixing member 175 and the cylindrical body 128.

A screw recess 166a is formed on the lower face of the piston 166. The above abutting part 160 is provided with an insert part 160b for receiving the top end of the rod 170. A screw part 160d is formed on the inner circumferential face of the insert part 160b. While, a screw part 170d is formed on the outer circumferential face of the top end of the rod 170. In order to fix the abutting part 160 with the rod 170, a tool is engaged in the screw recess 166a while disposing the rod 170 in the cylindrical part 172 and the spring 174. Then, by rotating the piston 166 and the rod 170 by means of the tool, the screw part 160d is engaged with the screw part 170d.

Connecting the periphery of the lower end of the abutting part 160 with the top periphery of the ring member 178, the diaphragm 162 is shaped to be a membrane covering the top face of the ring member 178. The lower face of the abutting part 160, the diaphragm 162 and the top face of the ring member 178 constitute a continuous face. A space surrounded by the lower face of the abutting part 160, the diaphragm 162 and the top face of the ring member 178 provide a deformable space S4 that is expanded or shrunk due to the elastic deformation of the diaphragm 162. Noted that the abutting part 160, the diaphragm 162 and the fixing member 175 may be made of e.g. PTFE (polytetrafluoro-ethylene) etc. In this case, the abutting part 160, the diaphragm 162 and the fixing member 175 may be formed in one body.

Between the inner circumferential face of the cylinder 165 and the outer circumferential face of the piston 166, a packing ring 181 is disposed to prevent fluid from entering the deformable space S4. The packing ring 181 is fitted in an annular groove 182 formed on the circumference of the piston 166, providing a seal between the inner circumferential face of the cylinder 165 and the outer circumferential face of the piston 166. The lower face of the packing ring 181 is reverse-Y shaped so as to diverge downward, so that an outer circumferential part 181a spreading outward comes in annular contact with the inner circumferential face of the cylinder 165. In FIG. 6, if fluid is about to flow from the underside of the packing ring 181 upward, the outer circumferential part 181a is expanded out by the fluid and urged against the inner circumferential face of the cylinder 165. Therefore, it is possible to prevent the fluid from flowing from the underside of the piston 166 upward. That is, it is possible to prevent the inflow of fluid from the fluid space 133 into the deformable space S4.

In the press device 130 constructed above, when the pressure device 152 supplies the fluid space 133 with the pressurized fluid, all of the abutting part 160, the rod 170 and the piston 166 are pushed up in opposition to an elastic force of the spring 174. Consequently, the abutting part 160 is moved to the position in contact with the periphery of the wafer W. At this time, the diaphragm 162 having the periphery fixed to the ring member 178 return the normal state exhibiting no elastic deformation, so that the deformable space S4 swells. On the other hand, when moving the abutting part 160 to the position apart from the periphery of the wafer W, the fluid is sucked from the fluid space 133 by the suction device 153 to reduce a fluid pressure. As a result, all of the abutting part 160, the rod 170 and the piston 166 are pushed down due to an elastic force of the spring 174. At this time, with the downward movement of the abutting part 160, the periphery of the diaphragm 162 around the abutting part 160 is pulled downward, so that the diaphragm 162 is elastically deformed to expansion. Then, the deformable space S4 shrinks.

Meanwhile, a space surrounded by the lower face of the abutting part 160, the diaphragm 162, the inner face of the fixing member 175 and the top face of the piston 166 (incl. the deformable space S4) is brought into sealed condition due to the sealing of the packing ring 181. Further, in the condition that the abutting part 160 is moved to its isolated position, the fluid space 133 has a negative pressure as a result of sucking an atmosphere therein. If the diaphragm 162 is broken by cracks, then the outside atmosphere enters the deformable space S4 through the cracks and furthermore, the outside atmosphere enters the fluid space 133 from the upside of the packing ring 181, so that a pressure in the fluid space 133 gradually rises. Nevertheless, owing to the provision of the pressure sensor 155 detecting such a rise in pressure, it is possible to detect an occurrence of cracks etc. in the diaphragm 162.

As for the press devices 130 in a row, a pitch of the recesses 160a of the abutting parts 160 is twice as long as the pitch of the holding grooves 95, 96. That is, the holding rod 97 is equipped with the press devices 130 corresponding to the wafers W in even-numbered order (from the disk 91) of the wafers W to be retained in the rotor 70 although the rod 97 does not include the press devices 130 corresponding to the wafers W in odd-numbered order. On the other hand, the holding rod 98 on the opposite side of the rod 97 is equipped with the press devices 130 corresponding to the wafers W in odd-numbered order (from the disk 91) of the wafers W to be retained in the rotor 70 although the same rod 98 does not include the press devices 130 corresponding to the wafers W in even-numbered order. That is, in the wafers W of twenty five pieces, the wafers W in even-numbered order are subjected to pressures by the press devices 130 on the holding rod 97, while the wafers W in odd-numbered order are subjected to pressures by the press devices 130 on the holding rod 98.

Aiming a flat part 128a' downward in FIG. 4, the holding rod 98 is formed by a cylindrical body 128 bridging between the disks 91, 92 and thirteen press devices 130 arranged on the side of the cylindrical body 128 close to the holding space S3, at regular intervals in the longitudinal direction of the body 128. In the longitudinal direction of the flat part 128a', thirteen retaining ports 135 are arranged to receive and hold the press devices 130 at regular intervals, corresponding to the wafers W in odd-numbered order from the disk 91. Noted that the holding rod 98 has a structure in symmetry with that of the holding rod 97 about the rotational center axis RO as the center in symmetry, except the positions of the retaining ports 135 and the press devices 130. The above fluid pipe 148 branches at the center of the disk 91, also is connected with a fluid space 133 in the holding rod 98.

In this way, an increase in the pitch of the press devices 130 allows a lateral (horizontal) width of each press device 130 to be increased. Then, by increasing an area of the diaphragm 162, it is possible to reduce the deformation amount of the diaphragm 162 per unit area in relation to the vertical strokes of the abutting part 160, the rod 170 and the piston 166 in loading the wafers W into the rotor 70 and unloading the wafers W therefrom. Accordingly, it is possible to prevent an occurrence of permanent set and cracks in the diaphragm 162, thereby extending its life span. Alternatively, with the establishment of the large strokes of the abutting part 160, the rod 170 and the piston 166, it is possible to increase a distance between the periphery of the wafer W and the abutting part 160 in loading/unloading the wafers W. Consequently, with the prevention on interference between the abutting part 160 and the periphery of the wafer W, it is possible to load the wafers W into the rotor 70 and also possible to unload the wafers W from the rotor 70 smoothly and safely.

The holding rod 99 holding the right-and-lower parts of the peripheries of the wafer W of FIG. 4 and the holding rod 100 holding the right-and-upper parts of the peripheries of the wafer W are respectively bridged between the disks 91, 92 and also provided, on the side of the holding space S3, with holding grooves 99a, 100a for holding the peripheries of the wafers W. Twenty five holding grooves 99a, 100a are formed at regular intervals in the longitudinal direction of the holding rods 99, 100, respectively. The pitch of the holding grooves 99a is equal to that of the holding grooves 100a, corresponding to twenty five wafers W. Each of the grooves 99a, 100a is substantial-V shaped with opposing slanted faces between which the periphery of the wafer W is to be inserted and retained.

With the above-mentioned arrangement, the wafers W are held by the rotor 70 while engaging the peripheries of the wafers W with the holding grooves 95a, 96a, 99a and 100a.

Then, when moving the abutting parts 160 of the press devices 130 of the holding rods 97, 98 to their apart positions, the peripheries of the wafers W are not pressed against the bottoms of the holding grooves 95a, 96a, 99a, 100a in spite of the engagement of the grooves 95a, 96a, 99a, 100a with the peripheries of the wafers W. Therefore, because of the presence of slight play between the peripheries of the wafers W and these holding grooves, there is a possibility that the peripheries of the wafers W are deviated from the holding grooves 95a, 96a, 99a, 100a in the circumferential direction due to an abrupt rotation of the rotor 70.

On the contrary, when the press devices 130 in the holding rod 97 are operated to bring the abutting parts 160 into the abutting positions, the wafers W are urged against the holding grooves 96a and the holding grooves 100a by the abutting parts 160. That is, the peripheries of the wafers W are held by the abutting parts 160, the holding grooves 96a and the holding grooves 100a, at three positions under pressures each, certainly. Therefore, even if the rotor 70 is rotated abruptly, it is possible to prevent an occurrence of deviations between the peripheries of the wafers W and the holding grooves 96a, 100a.

Likewise, when the press devices 130 in the holding rod 98 are operated to bring the abutting parts 160 into the abutting positions, the peripheries of the wafers W are held by the abutting parts 160 of the holding rod 98, the holding grooves 95a and the holding grooves 99a, at three positions under pressures each, thereby preventing the peripheries of the wafers W from deviating from the holding grooves 95a, 99a.

Noted that the pressure of the press device 130 on the periphery of each wafer W is controlled by a fluid pressure that the fluid in the fluid space 133 applies on the cylinder mechanism 161 due to the controls on the pressure device 152 and the suction device 153. In order to prevent the peripheries of the wafers W from deviating from the holding grooves 95a, 96a, 99a, 100a, the press devices 130 are controlled so as to produce the larger pressures as the higher the rotor 70 rotates, the larger the weight of each wafer, the inertia moment and the eccentric force become, or the smaller the maximum of static frictional coefficient of the abutting parts 160 becomes.

For example, if the diaphragm 162 has cracks to cause the outflow of atmosphere under condition of a constant pressure applied on the wafer W, the condition resulting by closing the three-directional valve 151 to establish a constant fluid pressure in the fluid space 133 and the fluid pipe 148 after moving the abutting part 160 to its abutting position by the pressurized fluid from the pressure device 152, there is a fear that the pressure on the wafer W is reduced to produce a deviation between the periphery of the wafer W and the holding rods 95 to 100. However, since the pressure sensor 155 is adapted so as to detect such a reduction in fluid pressure in the fluid space 133 and the fluid pipe 148, it is possible to detect the occurrence of cracks in the diaphragm 162 earlier, thereby preventing the reduction in pressure of the press devices 130. Thus, it is possible to prevent an insufficient processing on the wafers W due to insufficient pressures applied thereon.

Next, the processing method using the processing apparatus 1 of this embodiment will be described. First, the locking state of the lock pins 122 of the rotor 70 is canceled by the closing mechanism (not shown) outside the apparatus 1 and the holding rods 95, 96 are opened. By the wafer transfer mechanism (not shown), twenty five wafers W are transferred against the holding rods 99, 100 through the loading/unloading position and loaded into the rotor 70. Then, since the press devices 130 of the holding rods 97, 98 occupy their apart positions to depart the abutting parts 160 from the peripheries of the wafers W, it is possible to load the wafers W into the rotor 70 smoothly with no contact with the abutting parts 160. In this way, the peripheries of the wafers W are inserted into the holding grooves 99a, 100a, thereafter, the holding rods 95, 96 are together closed and the peripheries of the wafers W are inserted into the holding grooves 95a, 96a. When the lock pins 122 are locked up with the withdrawal of the wafer transfer mechanism, the wafers W are held by the holding rods 95, 96, 99, 100. In this state, the abutting parts 160 of the press devices 130 are brought into abutment with the peripheries of the wafers W, producing pressures applied thereon. Due to the pressures, the peripheries of the wafers W are urged against the holding grooves 95a, 96a, 99a, 100a, whereby the wafers W can be retained in the rotor 70 certainly. Next, the movable supporting mechanism transfers the rotor rotating mechanism 10 to the substrate processing apparatus 1 and carries the mechanism 10 while making the rotational center axis RO in the horizontal direction and also making the disk 92 oppose the port 17 for the mechanism 10. The rotor 70 having the wafers W inserted thereinto moves forward and enters the double chamber 8 through the port 17. At this time, the double chamber 8 stands ready in a state that the inner chamber 6 is arranged in the processing position in the outer chamber 5. The rotor 70 is disposed in the inner chamber 6, while the lid body 73 closes the ports 17, 47. In this way, the processing space S1 in the closed state is produced.

Next, it is started to rotate the rotor 70 from its standstill state to a designated rotating speed. As the press devices 130 of the holding rods 97, 98 apply pressures on the peripheries of the wafers W respectively even when accelerating the rotating speed of the rotor 70, the peripheries of the wafers W are urged against the holding grooves 95a, 96a, 99a, 100a, thereby suppressing the wafers' slipping. In this way, it is possible to rotate the wafers W and the rotor 70 in one body while holding the wafers W without producing any deviation between the peripheries and the holding rods 95 to 100. While, a chemical liquid is ejected from the processing-liquid nozzle 43 to spray the chemical liquid against the wafers W in rotation. Consequently, contaminations adhering to the wafers W, such as particles and organic contaminants, are removed off the wafers W.

After completing the chemical processing, the wafers W are rotated at a high speed in comparison with the revolutions at the chemical processing, so that the chemical liquid on the wafers W is shaken for its removal by a centrifugal force derived from the rotation of the wafers W. During this process, even when accelerating the rotation of the rotor 70 to a higher speed than in the case of chemical process, the press devices 130 exert pressures to the peripheries of the wafers W. Therefore, it becomes possible to rotate the wafers W and the rotor 70 in one body while holding the wafers W without producing any deviation between the peripheries and the holding rods 95 to 100.

After shaking the wafers W, the inner chamber 6 is withdrawn from the outer chamber 7 to the withdrawal position, thereby defining the processing space S2 in the closed state in the outer chamber 7. Thereafter, deionized water is ejected from the processing-fluid nozzle 13 to the wafers W for rinse. At this rinsing, the rotor 70 is rotated at a low speed in comparison with the speed at shaking. Even when decelerating the rotation of the rotor 70 from the high speed at shaking to the low speed, the press devices 130 continue to exert pressures to the peripheries of the wafers W. Therefore, at this process, it becomes possible to rotate the wafers W and the rotor 70 in one body while holding the wafers W without producing any deviation between the peripheries and the holding rods 95 to 100.

Next, the cylinder mechanisms 161 allows the abutting parts 160 to depart from the peripheries of the wafers W to cancel the pressing operation of the press devices 130 to produce deviations between the peripheries of the wafers W and the holding rods 95 to 100 by making use of inertia force of the wafers W in rotation. Consequently, new wafers' portions, which are different from the previous wafers' portions that were held by the holding grooves 95a, 96a, 99a, 100a before canceling the pressing operation of the press devices 130, are inserted into the holding grooves 95a, 96a, 99a, 100a. That is, the press devices 130 again exert pressures to the peripheries of the wafers W to hold their portions different from those at the previous rinsing process before canceling the pressing operation of the press devices 130. Consequently, it becomes possible to supply pure water to rinse even the previous wafers' portions held by the holding grooves 95a, 96a, 99a, 100a before canceling the pressing operation of the press devices 130, whereby the whole wafers W can be rinsed uniformly.

On completion of the rinsing process, a drying process starts. In the drying process, the wafers W are rotated at a higher speed (e.g. 800 rpm) than that at the rinsing process and simultaneously, inert gas (e.g. nitrogen gas), volatile and hydrophilic IPA vapor, etc. is blown from the processing-fluid discharging nozzle 13 against the wafers W to dry them. In transferring from the rinsing process to the drying process, since the press devices 130 exert pressures to the peripheries of the wafers W even when accelerating the rotation of the rotor 70 from the low speed to a high speed, it is possible to rotate the wafers W without producing any deviation between the peripheries of the wafers W and the holding rods 95 to 100.

After drying the wafers W, the rotor 70 is stopped rotating. Also in this case, since the press devices 130 exert pressures to the peripheries of the wafers W, it is possible to decelerate and stop the rotation of the rotor 70 to its standstill while holding the wafers W without producing any deviation between the peripheries of the wafers W and the holding rods 95 to 100.

Thereafter, the not-shown movable supporting mechanism moves the rotor 70 back in the horizontal direction to withdraw the rotor 70 from the double chamber 6 through the port 17. Then, the cylinder mechanisms 161 allows the abutting parts 160 of the press device 130 to depart from the peripheries of the wafers W to cancel the pressing operation of the press devices 130. Further, by the not-shown closing mechanism outside the substrate processing apparatus 1, the lock pins 122 of the rotor 70 are released from their locked state and the holding rods 95, 96 open. Further, by the not-shown wafer transfer mechanism, twenty five wafers W are transferred from the loading/unloading position to the outside of the rotor 70. Then, since the press devices 130 of the holding rods 97, 98 occupy their apart positions to depart the abutting parts 160 from the peripheries of the wafers W, it is possible to discharge the wafers W from the rotor 70 smoothly without producing contacts between the peripheries of 25 pieces of wafers W and the abutting parts 160.

According to the substrate processing apparatus 1, since each of the abutting parts 160 can be moved to both of the abutting position and the withdrawal position by the cylinder mechanism 161, there is no fear of applying excessive loads on the diaphragms 162. Thus, it is possible to prevent the occurrence of permanent set and cracks in the diaphragms 162, thereby extending the life span.

Then, by reducing the deformation amount of the diaphragm 162 per unit area in relation to the vertical strokes of the abutting part 160, the rod 170 and the piston 166, it is possible to prevent the occurrence of permanent set and cracks in the diaphragm 162 furthermore. Additionally, since the interference of the abutting part 160 with the periphery of the wafer W is prevented by broadening a gap therebetween in loading the wafers W into the rotor 70, it is possible to load the wafers W into the rotor 70 and discharge the wafers W therefrom smoothly and safely.

The present invention is not limited to the above-mentioned embodiment only. For example, without being limited to semiconductor wafer only, the present invention is also applicable to process the other substrate, for example, glass for LCD substrate, CD substrate, printed baseplate, ceramic substrate, etc. Additionally, the invention is not limited to only the substrate processing apparatus and method for cleaning substrates with chemicals. The present invention is also applicable to substrate processing apparatus and method for applying the other treatments besides cleaning to substrates while using various processing liquids.

Noted that two opposing rods 97, 98 of the holding rods 95 to 100 are respectively equipped with the press devices 130 in the above-mentioned embodiment. In the modification, of course, the other holding rods may be equipped with the press devices 130, similarly. Further, the apparatus may be constructed so that two or more press devices 130 take part in holding the periphery of a single wafer. The rotor 70 may include one or more supplementary holding rods.

As shown in FIGS. 8A and 8B, the press devices 130 and abutting members 190 may be arranged on the flat part 128*a* alternately. Then, the holding rod 97 has the press devices 130 arranged at respective positions in abutment with the peripheries of the wafers W in even-numbered order and the abutting members 190 arranged at respective positions in abutment with the peripheries of the wafers W in odd-numbered order. While, the holding rod 98 has the abutting members 190 arranged at respective positions in abutment with the peripheries of the wafers W in even-numbered order and the press devices 130 arranged at respective positions in abutment with the peripheries of the wafers W in odd-numbered order.

In the above-mentioned arrangement, if the abutting part 160 of each press device 130 in the holding rod 97 is moved to the abutting position, then the wafer W is pressed by the holding grooves 96*a*, 100*a* and the abutting member 190 in the holding rod 98. As a result, the wafer W is held under pressure at four positions consisting of the abutting part 160 of each press device 130 in the holding rod 97, the holding grooves 96*a*, 100*a* and the abutting member 190 in the holding rod 98.

In the foregoing descriptions, we have already explained that the diaphragm 162 returns its normal state when moving the abutting part 160 to the abutting position and that the diaphragm 162 is deformed when moving the abutting part 160 to the apart position. In the modification, of course, the press device 130 may be constructed so that the diaphragm 162 is deformed to expand upward when moving the abutting part 160 to the abutting position, while the diaphragm 162 returns its normal state when moving the abutting part 160 to the apart position. Alternatively, the press device 130 may be constructed so as to cause the diaphragm 162 to be deformed upward and downward when moving the abutting part 160 to the abutting position and the apart position, respectively.

Figure 9A:
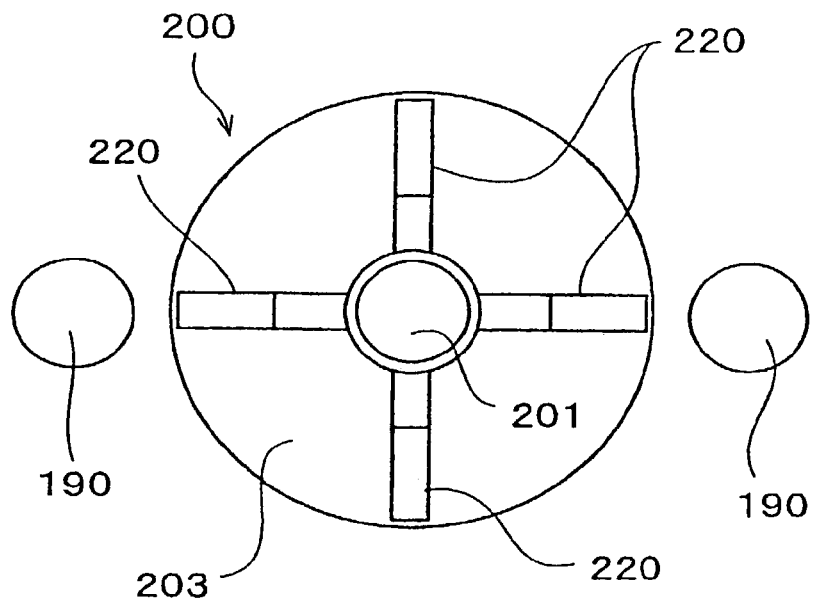
FIGS. 9A and 9B are views showing a press unit holding rod where press units and abutting members are arranged, in accordance with a further embodiment of the invention.
Figure 9B:
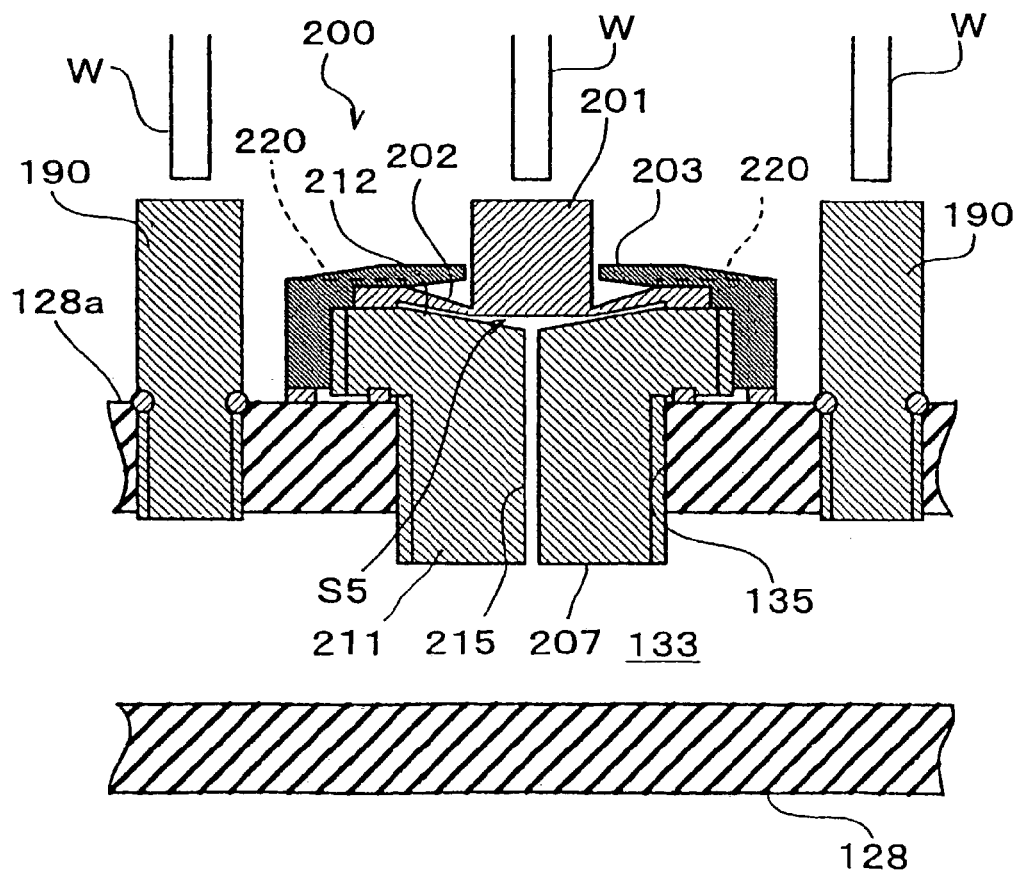

As shown in FIGS. 9A and 9B, each of the holding rods 97, 98 may be provided with a press device 200 in place of the above press device 130. The press device 200 includes an abutting part 201 for abutment with the periphery of the wafer W, a diaphragm 202 supporting the abutting part 201 and capable of elastic deformation and a stopper member 203 for covering the top face of the diaphragm 202.

The abutting part 201 is supported on the center of the circular diaphragm 202. The periphery of the diaphragm 202 is fixed to a support member 207. The support member 207 includes a column part 211 for engagement with the retaining port 135 and fixes the whole press device 200 to the cylindrical body 128. In FIG. 9B, the top face of the support member 207 is covered with the diaphragm 202 and also provided with a recess 212. The lower part of the column part 211 projects into the fluid space 133. A fluid passage 215 penetrating the column part 211 opens into the fluid space 133 and the center of the recess 212. When pressurizing or depressurizing the fluid space 133, a pressure in a deformable space S5 surrounded by the diaphragm 202 and the recess 212 changes to deform the diaphragm 202 for expansion or shrinkage. Then, the path of fluid is formed by the fluid passage 215, the fluid space 133 and the fluid pipe 148.

When the fluid is introduced into the deformable space S5 by increasing a fluid pressure in the fluid space 133, the deformable space S5 swells and the diaphragm 202 pushes up the abutting part 201 toward the abutting position for abutment with the periphery of the wafer W. On the contrary, when the fluid is discharged from the deformable space S5 by reducing the fluid pressure in the fluid space 133, the deformable space S5 shrinks and the diaphragm 202 brings the abutting part 201 down to the apart position apart from the periphery of the wafer W.

In a condition that a rise in the fluid pressure in the fluid space 133 causes the diaphragm 202 to rise into abutment with the stopper member 203, there is no possibility of further deformation of the diaphragm 202. In this way, since the stopper member 203 suppress an elastic deformation of the diaphragm 202, it is possible to prevent it from being broken due to the excessive deformation. The stopper member 203 is provided with four drain grooves 220 that extend radially outward from the abutting part 200 and enable drainage of the processing liquids (e.g. chemical liquids, deionized watery adhering to a gap between the diaphragm 202 and the stopper member 203.

As similar to the previous embodiment, the fluid pipe 148 in connection with the fluid space 133 is connected with the pressure device 152 and the suction device 153. Further, the pressure sensor 155 is interposed in the pipe 148. If the diaphragm 202 is broken by cracks, then the outside atmosphere enters the deformable space S5 at sucking, so that a pressure in the fluid space 133 gradually rises. Nevertheless, owing to the provision of the pressure sensor 155 detecting such a rise in pressure, it is possible to detect an occurrence of cracks etc. in the diaphragm 202.

As for the method of producing deviations between the peripheries of the wafers W and the holding rods 95 to 100 thereby holding the peripheries of the wafers W at different wafers' portions from those at processing before canceling the pressing operation, the method may be carried out not only in the rinsing process but also the chemical process and also the drying process.

According to the substrate processing apparatus and method of the invention, there is no fear of applying excessive loads on the deformable parts of the press devices. Thus, it is possible to prevent the occurrence of permanent set and cracks in the deformable parts, thereby extending the life span. By reducing the deformation amount of each deformable part per unit area in relation to the vertical stroke of the abutting part, it is possible to prevent the occurrence of permanent set and cracks in the deformable parts furthermore. Additionally, it is possible to load and unload the substrates to and from the rotor smoothly and safely.

What is claimed is:

1. A substrate processing apparatus for processing substrates, comprising a rotor having holding members for holding peripheries of the substrates, the rotor rotating the substrates thereby processing the substrates, one of the holding members having press devices for applying pressures on the peripheries of a plurality of the substrates, the press devices having respective abutting parts, each of the press devices being configured to cause the abutting part thereof to come into elastic contact with or depart from the periphery of a corresponding one of the substrates by fluid pressure in a direction parallel to a surface of the corresponding substrate, the press devices of said one of the holding members pressing the corresponding substrates against another holding member to hold the corresponding substrates, respectively, the substrate processing apparatus further comprising a pressure device configured to apply the fluid pressure to the press devices; and a suction device configured to reduce the fluid pressure applied to the press devices.

2. The substrate processing apparatus as claimed in claim 1, wherein each of the press devices further includes:

a deformable part that supports an abutting part and is elastically deformed to move the abutting part between a position being in contact with the periphery of a substrate and another position apart therefrom; and a stopper member that covers the deformable part and restricts a deformation of the deformable part to move the abutting part toward the periphery of the substrate.

3. The substrate processing apparatus as claimed in claim 2, wherein each of the holding members is either a movable holding member movable in relation to the rotor or a fixed holding member fixed to the rotor, the press devices being provided in at least one fixed holding member.

4. The substrate processing apparatus as claimed in claim 3, wherein the movable holding member is arranged in its opened condition and the press devices are arranged in positions apart from the substrates when the substrates are loaded into the rotor or discharged therefrom.

5. The substrate processing apparatus as claimed in claim 3, wherein at least three holding members are arranged on the circumferences of the substrates.

6. The substrate processing apparatus as claimed in claim 5, wherein the at least three holding members comprise at least one movable holding member and at least two fixed holding members, the press devices being arranged in at least one of the fixed holding members.

7. The substrate processing apparatus as claimed in claim 6, wherein two or more substrates are arranged in parallel, the holding members extending in a direction to arrange the two or more substrates in parallel and being arranged on the circumferences of the two or more substrates in parallel.

8. The substrate processing apparatus as claimed in claim 7, wherein the press devices are arranged in two of the fixed holding members, a first fixed holding member and a second fixed holding member, the press devices provided in the first fixed holding member being arranged on the circumferential sides of odd-numbered substrates, the press devices provided in the second fixed holding member being arranged on the circumferential sides of even-numbered substrates.

9. The substrate processing apparatus as claimed in claim 2, wherein the each of the press devices includes:

a deformable space that expands and shrinks corresponding to the elastic deformation of the deformable part; and a fluid passage for introducing a fluid into the deformable space and deriving the fluid therefrom.

10. The substrate processing apparatus as claimed in claim 9, further comprising a pressure sensor for detecting a pressure of the fluid introduced into the deformable space and derived therefrom.

11. The substrate processing apparatus as claimed in claim 2, wherein the stopper member is provided with a drain groove for draining a liquid adhering between the deformable part and the stopper member.

12. A substrate processing apparatus for processing substrates, comprising a rotor having a first holding member, a second holding member, a third holding member and a fourth holding member, each of the first and second holding members for holding peripheries of the substrates arranged in parallel with each other, the rotor rotating the substrates thereby processing the substrates, the third and fourth holding members each having holding grooves the first and second holding members each having press devices for applying pressures on the peripheries of the substrates to press the substrates against the corresponding holding grooves, the press devices having respective abutting parts, the press devices being configured to cause the abutting parts to come into elastic contact with or depart from the peripheries of the substrates by fluid pressure in a direction parallel to a surface of the corresponding substrate, a pitch of the abutting parts of the first and second holding members being twice as long as a pitch of the holding grooves, the press devices of the first holding member being arranged on the circumferential sides of odd-numbered substrates, the press devices of the second holding member being arranged on the circumferential sides of even-numbered substrates.

* * * * *